(12) United States Patent
Lecler et al.

(10) Patent No.: US 11,126,431 B1
(45) Date of Patent: Sep. 21, 2021

(54) DYNAMIC MEMORY SCHEDULING ROUTINE WITH ENHANCED BANK-GROUP BATCHING

(71) Applicant: QUALCOMM Incorporated, San Diego, CA (US)

(72) Inventors: Jean-Jacques Lecler, Antibes (FR); Alain Artieri, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/888,493

(22) Filed: May 29, 2020

(51) Int. Cl.
*G06F 9/30* (2018.01)
*G06F 12/02* (2006.01)
*G11C 11/4096* (2006.01)

(52) U.S. Cl.
CPC ...... *G06F 9/30043* (2013.01); *G06F 12/0238* (2013.01); *G11C 11/4096* (2013.01); *G06F 2212/202* (2013.01)

(58) Field of Classification Search
CPC ............ G06F 9/30043; G06F 12/0238; G06F 2212/202; G11C 11/4096
USPC ........................................................ 711/105
See application file for complete search history.

(56) References Cited

U.S. PATENT DOCUMENTS

| 8,499,201 B1* | 7/2013 | Chiu ................... G06F 11/3037 714/46 |
| 2017/0148522 A1* | 5/2017 | Ma ....................... G11C 11/5642 |

* cited by examiner

*Primary Examiner* — Fernando Hidalgo
(74) *Attorney, Agent, or Firm* — Seyfarth Shaw LLP/Qualcomm Incorporated

(57) ABSTRACT

A method for dynamic memory scheduling with enhanced bank-group batching is described. The method includes determining a read-bank group-spread of each rank, as a number of bank-groups of each respective rank targeted by at least one read instruction. The method further includes determining a write-bank group-spread of each rank, as a number of bank-groups of each rank targeted by at least one write instruction. The method also includes stalling a current batch of read instructions in a rank when the read-bank group-spread of the rank is less than a predetermined value. The method further includes stalling a current batch of write instructions in a rank when the write-bank group-spread of the rank is less than the predetermined value.

20 Claims, 7 Drawing Sheets

DYNAMIC MEMORY SCHEDULING ROUTINE WITH ENHANCED BANK-GROUP BATCHING

BACKGROUND

Field

The present disclosure generally relates to memory scheduling. More specifically, aspects of the present disclosure relate to a dynamic memory scheduling routine with enhanced bank-group batching.

Background

Memory is a vital component for wireless communications devices. For example, a cell phone integrates memory as part of an application processor. Many wireless applications depend on the functionality of dynamic random access memory (DRAM), which is a type of volatile memory that consumes power to retain data. DRAM bit cells are generally implemented using complementary metal oxide semiconductor (CMOS) transistors.

Wireless communications device performance is continually driving a desire for maximum access capacity DRAM-based memory. To handle the ever increasing bandwidth demand, DRAM protocols enforce significant gaps between certain memory access. For example, DRAM protocols enforce significant gaps in the following scenarios: (A) a switch from a read to a write operation; (B) a switch from a write to a read operation; and (C) a switch from an access in a rank to an access in a different rank. As switching read/write directions and/or switching between ranks wastes bandwidth, improved DRAM scheduling is desired.

SUMMARY

A method for dynamic memory scheduling with enhanced bank-group batching is described. The method includes determining a read-bank group-spread of each rank, as a number of bank-groups of each respective rank targeted by at least one read instruction. The method further includes determining a write-bank group-spread of each rank, as a number of bank-groups of each rank targeted by at least one write instruction. The method also includes stalling a current batch of read instructions in a rank when the read-bank group-spread of the rank is less than a predetermined value. The method further includes stalling a current batch of write instructions in a rank when the write-bank group-spread of the rank is less than the predetermined value.

A non-transitory computer-readable medium having program code recorded thereon for dynamic memory scheduling with enhanced bank-group batching is described. The program code is executed by a processor. The non-transitory computer-readable medium includes program code to determine a read-bank group-spread of each rank, as a number of bank-groups of each respective rank targeted by at least one read instruction. The non-transitory computer-readable medium also includes program code to determine a write-bank group-spread of each rank, as a number of bank-groups of each rank targeted by at least one write instruction. The non-transitory computer-readable medium further includes program code to stall a current batch of read instructions in a rank when the read-bank group-spread of the rank is less than a predetermined value. The non-transitory computer-readable medium further includes program code to stall a current batch of write instructions in a rank when the write-bank group-spread of the rank is less than the predetermined value.

A memory subsystem is described. The memory subsystem includes a first memory rank having first bank groups, and a second memory rank having second bank groups. The memory subsystem includes an TO controller coupled to the first memory rank and the second memory rank. The memory subsystem further includes dynamic arbitration logic configured to determine a read-bank group-spread of the first memory rank and the second memory rank, as a number of bank-groups of each respective memory rank targeted by at least one read instruction. The dynamic arbitration logic is also configured to determine a write-bank group-spread of the first memory rank and the second memory rank, as a number of bank-groups of each memory rank targeted by at least one write instruction. The memory subsystem further includes a dynamic memory scheduler configured to stall a current batch of read instructions in a memory rank when the read-bank group-spread of the memory rank is less than a predetermined value. The dynamic memory scheduler is also configured to stall a current batch of write instructions in a memory rank when the write-bank group-spread of the memory rank is less than the predetermined value.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily used as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
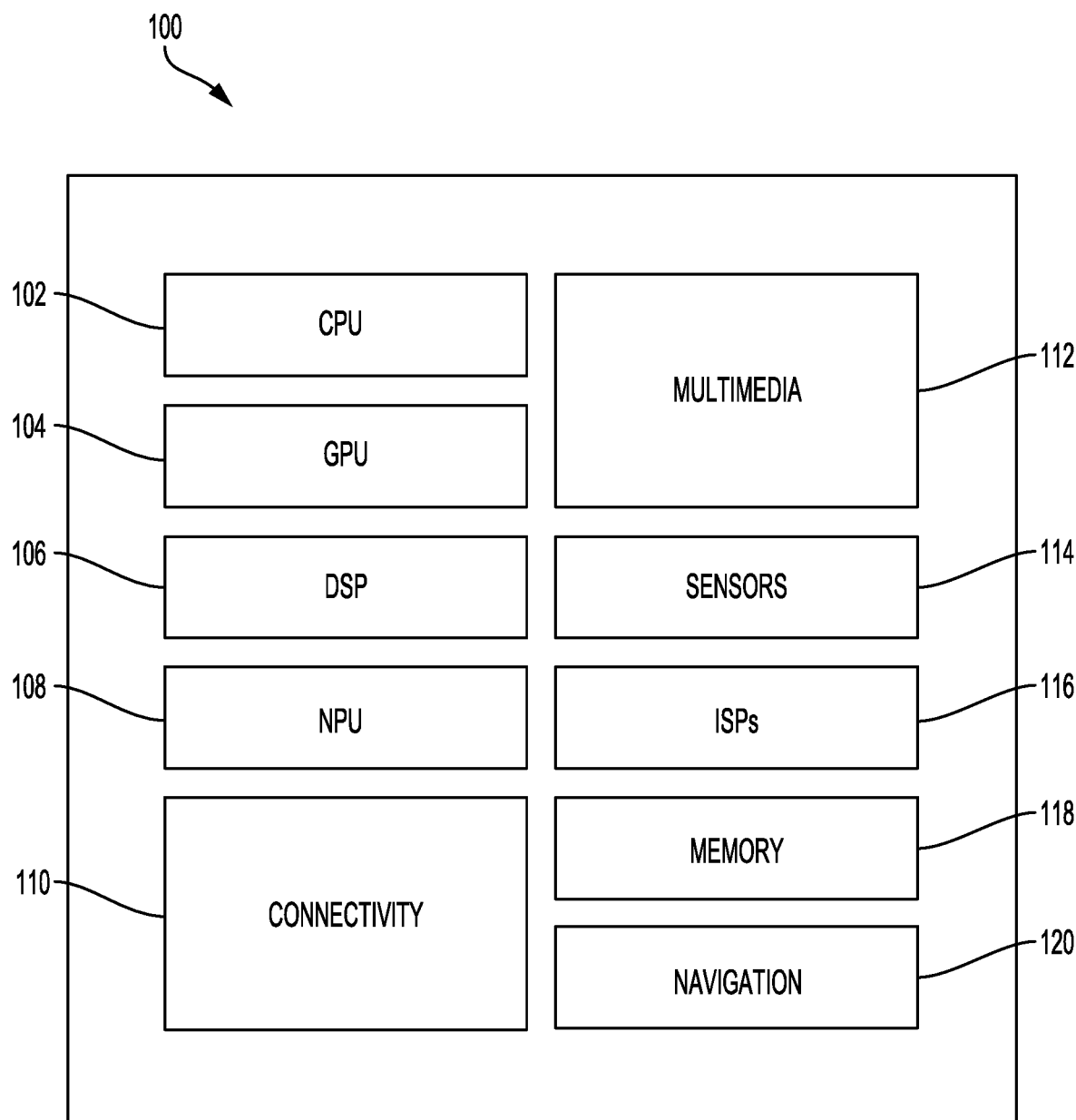
FIG. 1 illustrates an example implementation of a system-on-a-chip (SOC), including a memory configured according to a dynamic memory scheduling routine with enhanced bank-group batching, in accordance with certain aspects of the present disclosure.

The detailed description set forth below, in connection with the appended drawings, is intended as a description of various configurations and is not intended to represent the only configurations in which the concepts described may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts.

Based on the teachings, one skilled in the art should appreciate that the scope of the disclosure is intended to cover any aspect of the disclosure, whether implemented independently of or combined with any other aspect of the disclosure. For example, an apparatus may be implemented or a method may be practiced using any number of the aspects set forth. In addition, the scope of the disclosure is intended to cover such an apparatus or method practiced using other structure, functionality, or structure and functionality, in addition to or other than the various aspects of the disclosure set forth. It should be understood that any aspect of the disclosure disclosed may be embodied by one or more elements of a claim.

As described, the use of the term "and/or" is intended to represent an "inclusive OR," and the use of the term "or" is intended to represent an "exclusive OR." The word "exemplary" is used to mean "serving as an example, instance, or illustration." Any aspect described as "exemplary" is not necessarily to be construed as preferred or advantageous over other aspects.

Although particular aspects are described, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different technologies, system configurations, networks and protocols, some of which are illustrated by way of example in the figures and in the following description of the preferred aspects. The detailed description and drawings are merely illustrative of the disclosure, rather than limiting the scope of the disclosure being defined by the appended claims and equivalents thereof.

Memory is a vital component for wireless communications devices. For example, a cell phone integrates memory as part of an application processor. Many wireless applications depend on the functionality of a dynamic random access memory (DRAM), which is a type of volatile memory that consumes power to retain data. DRAM bit cells are generally implemented using complementary metal oxide semiconductor (CMOS) transistors.

Wireless communications device performance is continually driving a desire for maximum access capacity to DRAM-based memory. In operation, DRAM protocols enforce significant gaps between certain memory access to handle the ever increasing bandwidth demand. For example, DRAM protocols enforce significant gaps when switching read/write directions and/or switching between ranks. Unfortunately, enforcing gaps when switching between read/write directions and/or switching between ranks wastes significant bandwidth.

In practice, a DRAM memory scheduler is designed to interconnect various DRAM memory protocols (e.g., personal computer double data rate (PC-DDR), low power double data rate (LP-DDR), graphic double data rate (G-DDR)). As noted, DRAM protocols enforce significant gaps (e.g., equivalent to about ten wasted memory accesses) in the following scenarios: (A) a switch from a read to a write operation; (B) a switch from a write to a read operation; and (C) a switch from an access in a rank to an access in a different rank. As switching directions and/or between ranks wastes bandwidth, DRAM scheduling systems generally batch accesses. As described, batching accesses involves grouping accesses together in the same direction and the same rank.

Recent protocols (e.g., PC-DDR4, LP-DDR5, G-DDR5), however, introduced the concept of bank-groups over the traditional notion of banks. These protocols prohibit back-to-back accesses in the same bank-group. Thus, in order to sustain the peak throughput of a DRAM device, the DRAM scheduler interleaves accesses belonging to different bank-groups as batch access. Failure to interleave accesses results in a waste of half of an available peak bandwidth. As the batch access continues, the number of candidates for that batch belonging to different bank-groups decreases. At some point, the DRAM scheduler is left with two options: (1) either allow the batch to continue, which results in poor efficiency (e.g., due to the lack of bank-group spread); or (2) interrupt the batch, which results in an immediate penalty due to the batch switch.

Various aspects of a memory are presented in the context of a dynamic random access memory (DRAM) subsystem configured according to a dynamic memory scheduling routine with enhanced bank-group batching. DRAM is volatile memory that consumes power to retain data. Nevertheless, as those skilled in the art will readily appreciate, such aspects may be extended to other memories and/or circuit configurations. Accordingly, references to the DRAM subsystem are intended to illustrate aspects of the memory with the understanding that such aspects may be extended to a wide range of memory applications.

Aspects of the present disclosure are directed to dynamically controlling the point at which a batch is interrupted. In one aspect of the present disclosure, the interrupt point is selected to enhance the behavior (e.g., bandwidth quality of service (QoS)) of a memory subsystem. In contrast to existing solutions, the selected batch interrupt point does not involve additional settings and is compatible with dynamic priority management.

One aspect of the present disclosure relies on the existence of an arbitration scheme in a memory scheduler. This aspect of the present disclosure modifies the memory scheduler to prefer some candidates over other candidates. This candidate selection process first identifies the batch of each candidate at step one (1). For example, the batch of a candidate may be one of read/write operation for a single rank system, or one of read-0/read-1/write-0/write-1 in a dual rank system. Next, the candidate selection process identifies the bank-group of each candidate at step two (2). Once identified, a bank-group-spread (GS) of each batch is evaluated at step three (3). As described, the bank-group spread refers to the number of different bank-groups targeted by at least one candidate of the batch. The candidate selection process then evaluates a maximum bank-group-spread (MGS) at step four (4). As described, the MGS refers to a maximum of the bank-group-spread over the two or four different batches.

Following evaluation of the maximum of the bank-group-spread, gap detection is performed at step five (5). As described, a gap is defined as a temporal delay between two consecutive accesses. When memory accesses are back-to-back, there is no gap. In operation, steps (3), (4), and (5) are dynamically evaluated in hardware. In addition, values from steps (3) and (4) are updated whenever a new candidate applies or a candidate is elected. Step (5) is deasserted at each election for the access duration (typically a memory burst length). It is then re-asserted, except if a new access is elected. This aspect of the present disclosure modifies the memory arbitration scheme to prefer candidates for a batch whose bank-group-spread is maximal or whose bank-group-spread exhibits better variance during the detected gap in step (5).

FIG. 1 illustrates an example implementation of a host system-on-a-chip (SOC) 100, which includes a memory 118 configured according to a dynamic memory scheduling routine with enhanced bank-group batching, in accordance with aspects of the present disclosure. The host SOC 100 includes processing blocks tailored to specific functions, such as a connectivity block 110. The connectivity block 110 may include fifth generation (5G) connectivity, fourth generation long term evolution (4G LTE) connectivity, Wi-Fi connectivity, USB connectivity, Bluetooth® connectivity, Secure Digital (SD) connectivity, and the like.

In this configuration, the host SOC 100 includes various processing units that support multi-threaded operation. For the configuration shown in FIG. 1, the host SOC 100 includes a multi-core central processing unit (CPU) 102, a graphics processor unit (GPU) 104, a digital signal processor (DSP) 106, and a neural processor unit (NPU) 108. The host SOC 100 may also include a sensor processor 114, image signal processors (ISPs) 116, a navigation module 120, which may include a global positioning system, and a memory 118. The multi-core CPU 102, the GPU 104, the DSP 106, the NPU 108, and the multi-media engine 112 support various functions such as video, audio, graphics, gaming, artificial networks, and the like. Each processor core of the multi-core CPU 102 may be a reduced instruction set computing (RISC) machine, an advanced RISC machine (ARM), a microprocessor, or some other type of processor. The NPU 108 may be based on an ARM instruction set.

In an aspect of the present disclosure, the instructions loaded into the multi-core CPU 102 may include program code to stall a current batch of read instructions in a rank when the read-bank group-spread of the rank is less than a predetermined value. The instructions loaded into the multi-core CPU 102 may also include program code to stall a current batch of write instructions in a rank when the write-bank group-spread of the rank is less than the predetermined value.

Figure 2:
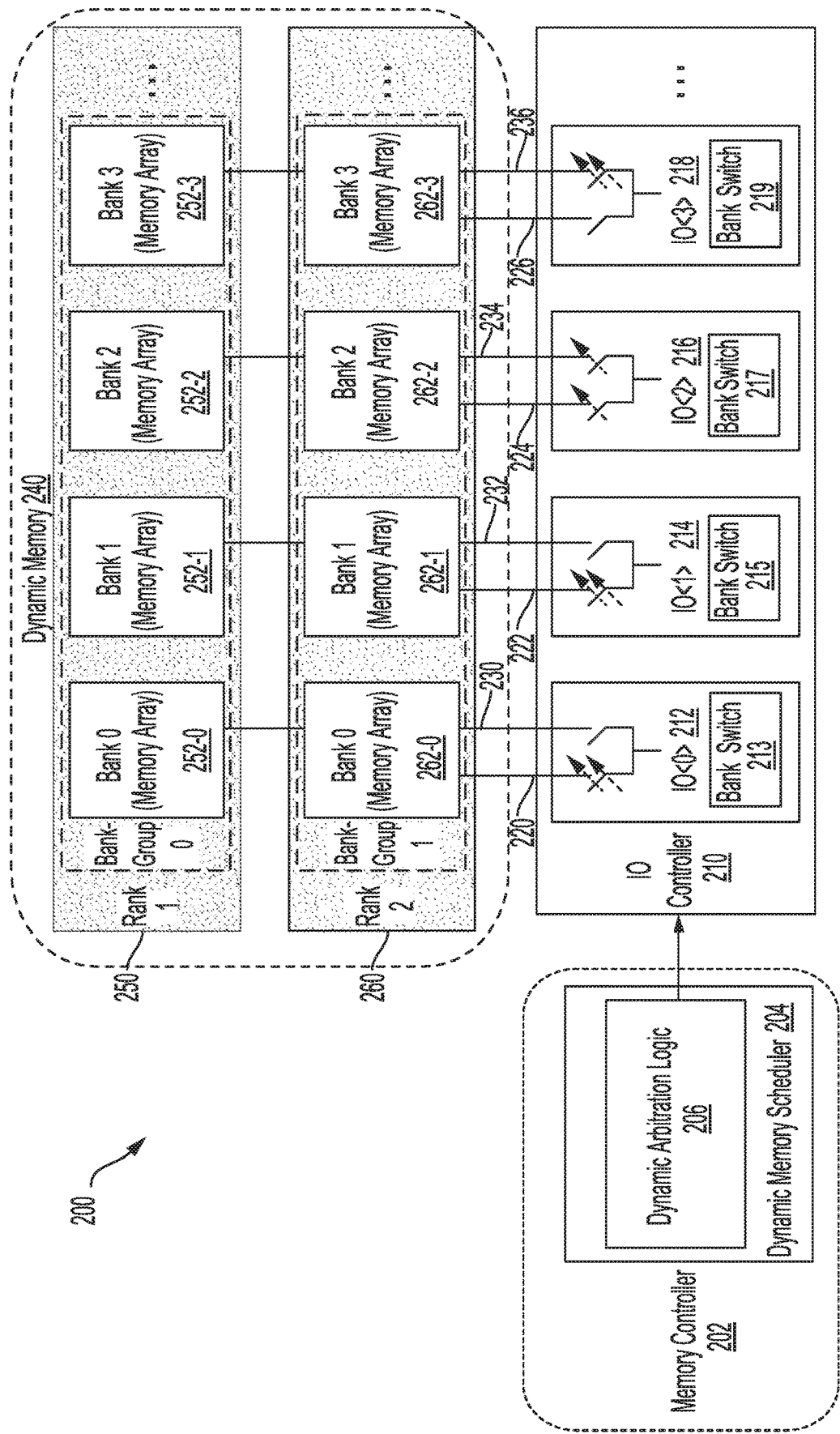
FIG. 2 is a circuit diagram of a logic configuration of a dynamic memory scheduling architecture of a memory with enhanced bank-group batching, in accordance with aspects of the present disclosure.

FIG. 2 is a circuit diagram of a memory subsystem having a dynamic memory scheduling architecture with enhanced bank-group batching, in accordance with aspects of the present disclosure. The memory subsystem 200 is configured according to a dynamic memory scheduling architecture for scheduling access to a dynamic memory 240, such as the memory 118 shown in FIG. 1. The dynamic memory 240 is shown with a first memory rank 250 and a second memory rank 260, which provide a medium for peripheral circuits (e.g., external to the dynamic memory 240) to write and read data (e.g., program instructions and data operated by the instruction). As described, the term "data" is understood to include program instructions, data, and any other information that may be stored in the dynamic memory 240.

The memory subsystem 200 may be any suitable memory technology, such as, by way of example, a DRAM (e.g., an eight-bank DRAM subsystem design). As described, a memory rank is a set of memory (e.g., DRAM) chips (or memory modules) coupled to the same chip select for enabling simultaneous access. For example, a memory rank may provide a wide data width (e.g., 64 bits/72 bits) of an addressable memory area of a memory module. Nevertheless, as those skilled in the art will readily appreciate, the memory subsystem 200 is not necessarily limited to DRAM. A DRAM includes an array of storage elements known as "cells," "memory cells," or "bit cells." Each memory cell is configured to store one bit of data (e.g., a logic 1 or a logic 0). FIG. 2 shows a dual-rank configuration of the memory subsystem 200.

Nevertheless, as those skilled in the art will readily appreciate, the memory subsystem 200 is not necessarily limited to a dual-rank memory subsystem.

The memory subsystem 200 is shown with the first memory rank 250 and the second memory rank 260, which provide a medium for peripheral circuits (e.g., external to the memory subsystem 200) to write and read data. In one configuration, the first memory rank 250 includes a first bank-group 252 (e.g., Bank 0 252-0, Bank 1 252-1, Bank 2 252-2, and Bank 3 252-3) of memory arrays. In addition, the second memory rank 260 includes a second bank-group 262 (e.g., Bank 0 262-0, Bank 1 262-1, Bank 2 262-2, and Bank 3 262-3) of memory arrays. For example, the banks (e.g., Bank 0 252-0, Bank 1 252-1, Bank 2 252-2, and Bank 3 252-3) of the first bank-group 252 and the banks (e.g., Bank 0 262-0, Bank 1 262-1, Bank 2 262-2, and Bank 3 262-3) of the second bank-group 262 may be composed of sixteen megabyte (16 Mb) DRAM arrays (e.g., 4096×4096 array of bits). In addition, the first memory rank 250 and the second memory rank 260 may be interleaved to improve the performance of the memory subsystem 200.

In aspects of the present disclosure, the memory subsystem 200 includes an input/output (ID) controller 210 coupled to dynamic arbitration logic 206 of a dynamic memory scheduler 204 of a memory controller 202. In this configuration, the 10 controller 210 includes a first IO 212, a second IO 214, a third IO 216, and a fourth IO 218. The first IO 212 includes a bank switch 213 configured to access the Bank 0 252-0/262-0, depending on the selected rank (e.g., 250/260) through data lines 220/230. Similarly, the second IO 214 includes a bank switch 215 configured to access the Bank 1 252-1/262-1, depending on the selected rank (e.g., 250/260) through data lines 222/232. The third IO 216 includes a bank switch 217 configured to access the Bank 2 252-2/262-2, depending on the selected rank (e.g., 250/260) through data lines 224/234. In addition, the fourth IO 218 includes a bank switch 219 configured to access the Bank 3 252-3/262-3 depending on the selected rank (e.g., 250/260) through data lines 226/236.

The memory subsystem 200 includes the memory controller 202 having the dynamic memory scheduler 204, including the dynamic arbitration logic 206. The memory controller 202 is configured to enforce gaps between certain memory access to the dynamic memory 240. For example, the dynamic memory scheduler 204 is configured to enforce gaps when switching between read/write directions and/or switching between the first memory rank 250 and the second memory rank 260. According to aspects of the present disclosure, the dynamic arbitration logic 206 is configured to reduce the enforced gaps when switching between read/write directions and/or switching between the first memory rank 250 and the second memory rank 260, which saves significant bandwidth.

In this example, the dynamic memory 240 is configured according to the concept of bank-groups, rather than the traditional notion of memory banks. This configuration prohibits back-to-back accesses in the same bank-group (e.g., the first bank-group 252 and the second bank-group 262). In this configuration, the dynamic memory scheduler 204 is configured to interleave batch accesses belonging to different bank-groups for sustaining a peak throughput of the dynamic memory 240. Failure to interleave batch accesses results in a waste of half the specified peak bandwidth of the dynamic memory 240.

As described, a batch may refer to one of a read operation or a write operation in one rank (e.g., the first memory rank 250 or the second memory rank 260). For example, for a single-rank memory subsystem, two batch accesses are defined as two read/write operations to the memory rank. For a dual-rank memory subsystem, four batch accesses are defined as two read/write operations to the first memory rank (e.g., R0/R1) and two read/write operations to the second memory rank (e.g., W0/W1). In addition, as defined, a candidate belongs to one of the defined batch accesses. Furthermore, as described, a group-spread (GS) of a batch access is defined as the number of bank-groups with at least one candidate of the batch access (e.g., the dynamic memory 240 may support four groups R0/R1/W0/W1). A maximum-group-spread (MGS) is also considered.

In operation, as a batch access to the dynamic memory 240 continues, the number of candidates for that batch access belonging to different bank-groups decreases. At some point, the dynamic memory scheduler 204 is left with two options: (1) either allow the batch access to continue, which results in poor efficiency (e.g., due to a lack of bank-group spread); or (2) interrupt the batch access, which results in an immediate penalty due to the batch switch.

In aspects of the present disclosure, the dynamic arbitration logic 206 is configured to dynamically control the point at which a batch is interrupted. In one aspect of the present disclosure, the dynamic arbitration logic 206 selects the interrupt point to enhance the behavior (e.g., bandwidth QoS) of the memory subsystem 200. In contrast to existing solutions, the selected batch interrupt point does not involve additional settings and is compatible with dynamic priority management, for example, as shown in FIG. 3.

Figure 3:
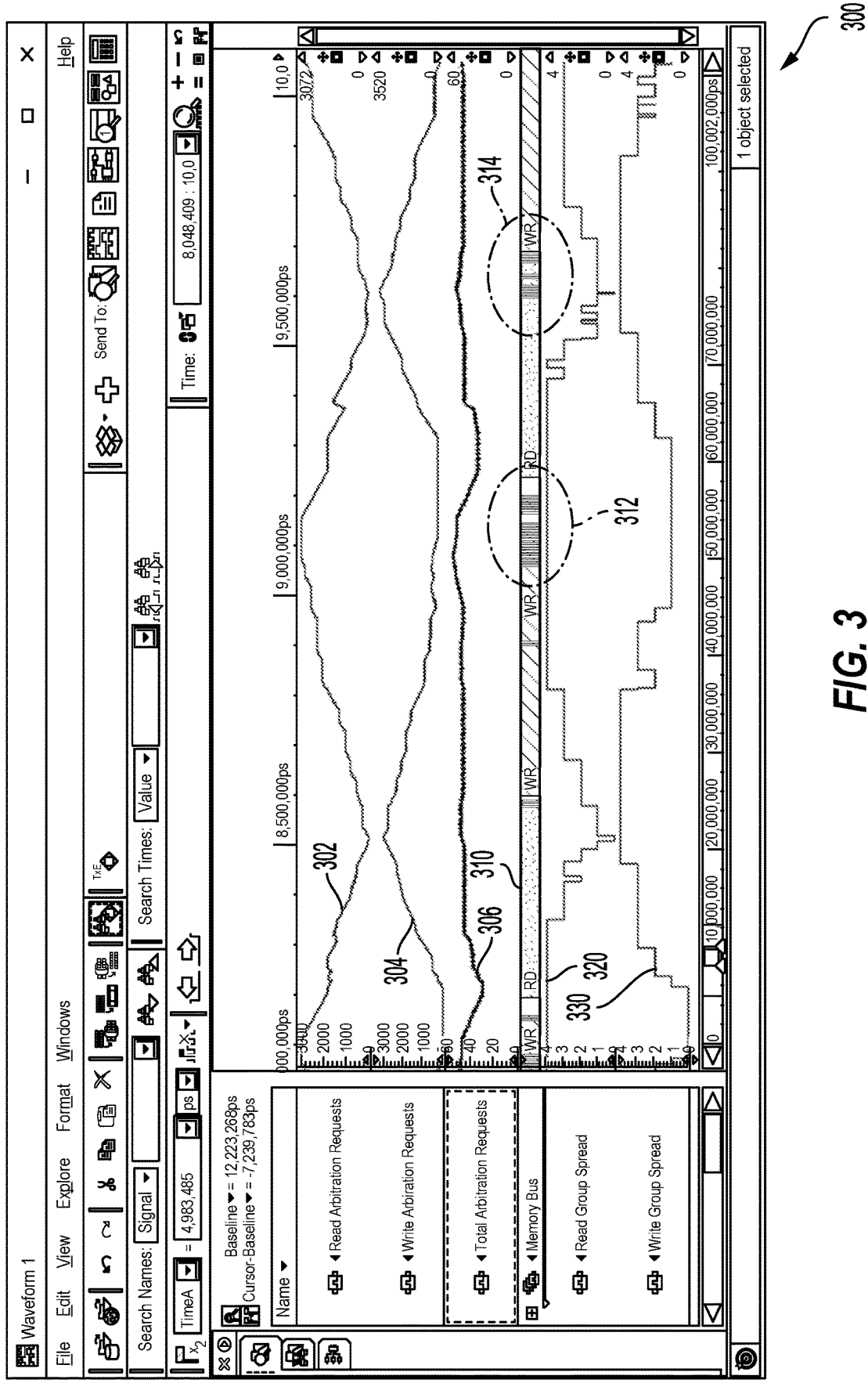
FIG. 3 is a timing diagram illustrating waveforms showing batching of read and write operations, according to aspects of the present disclosure.

FIG. 3 is a timing diagram illustrating waveforms showing batching of read and write operations, according to aspects of the present disclosure. In this example, the timing diagram 300 illustrates read arbitration requests 302, write arbitration requests 304, and total arbitration requests 306. The timing diagram 300 also illustrates a memory bus 310, a read group-spread 320, and a write group-spread 330. As noted by the memory bus 310, there are approximately forty-eight (48) candidates (e.g., total arbitration requests 306) illustrated for a memory cycle time (e.g., one millisecond). As shown by the memory bus 310, at the end of each read batch (RD) and each write batch (WR), resources are exhausted (as well as a group-spread defined below). In this example, a write tail 312 and a read tail 314 are shown with many fine gaps, which result in poor memory efficiency. The write tail 312 and the read tail 314 are generally due to the bank-group restrictions noted above.

Figure 4:
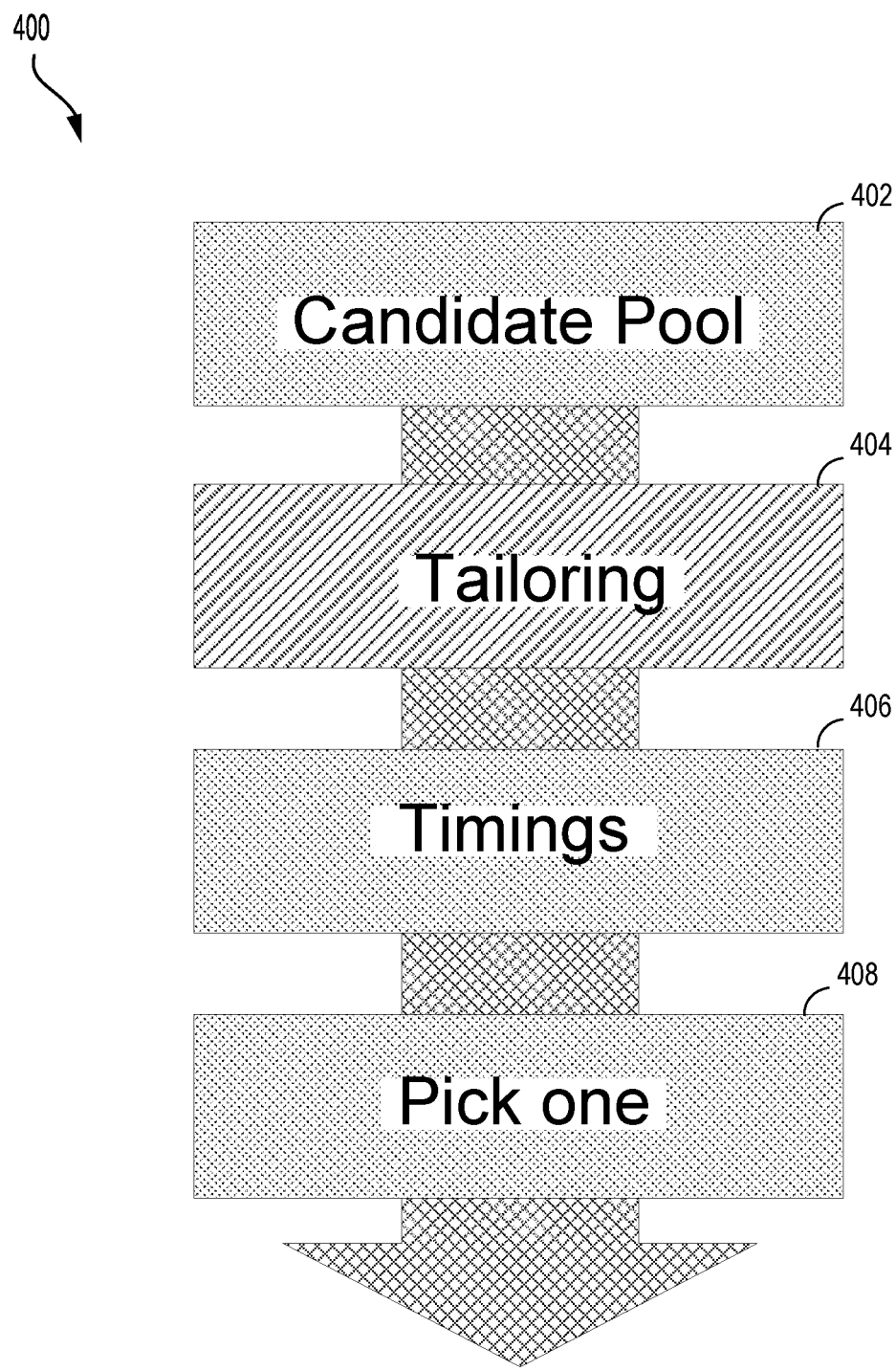
FIG. 4 is a flowchart illustrating a bank-group memory scheduling method using enhanced batching, according to aspects of the present disclosure.

FIG. 4 is a flowchart 400 illustrating a bank-group memory scheduling method using enhanced batching, according to aspects of the present disclosure. Aspects of the present disclosure modify the dynamic memory scheduler 204 of FIG. 2 to prefer some candidates over other candidates. In this aspect of the present disclosure, the dynamic arbitration logic 206 of FIG. 2 is configured according to a candidate selection process. In one configuration, the candidate selection process first identifies the batch of each candidate at block 402 as part of a candidate pool. For example, the batch of a candidate may be one of read/write operations for a single rank system, or one of read-0/read-1/write-0/write-1 operations in a dual rank system. Next, a tailoring process identifies the bank-group of each candidate at block 404. Once identified, a bank-group-spread (GS) of each batch is evaluated as part of a tailoring process of block 404. As described, the bank-group-spread refers to the number of different bank-groups targeted by at least one candidate of the batch access. The tailoring process then evaluates a maximum bank-group-spread (MGS) at block 404. As described, the maximum bank-group-spread refers to a maximum of the bank-group-spread over the two or four different batches.

Following evaluation of the maximum of the bank-group-spread, gap detection is performed at block 406. As described, a "gap" is defined as a temporal delay between two consecutive accesses. When memory accesses are back-to-back, there is no gap. In operation, values of the tailoring process of block 404 are dynamically evaluated in hardware. In addition, values of the tailoring process of block 404 are updated whenever a new candidate applies or a candidate is elected. At block 408, a candidate is selected. In operation, block 408 is deasserted at each election, for the access duration (typically a memory burst length). It is then re-asserted, except if a new access is elected. This aspect of the present disclosure modifies the dynamic arbitration logic 206 of FIG. 2 to prefer candidates for a batch whose bank-group-spread is maximal or whose bank-group-spread exhibits better variance during the detected gap in block 406.

The tailoring process of block 404 is implemented by the dynamic arbitration logic 206 of FIG. 2. For example, the dynamic arbitration logic 206 may interrupt a batch of read/write operations when the group-spread (GS) of the batch is less than a maximum-group-spread (MGS) and a gap is detected. This configuration interrupts the batch earlier when the group-spread is no longer maximal (e.g., GS<MGS). Interruption based solely on this criteria, however, may be too aggressive. According to aspects of the present disclosure, the dynamic arbitration logic 206 may wait for a further gap to interrupt the batch and perform a batch switch. According to this tailoring process, tails of the batch read and batch write operations are substantially reduced, as shown in FIG. 5.

Figure 5:
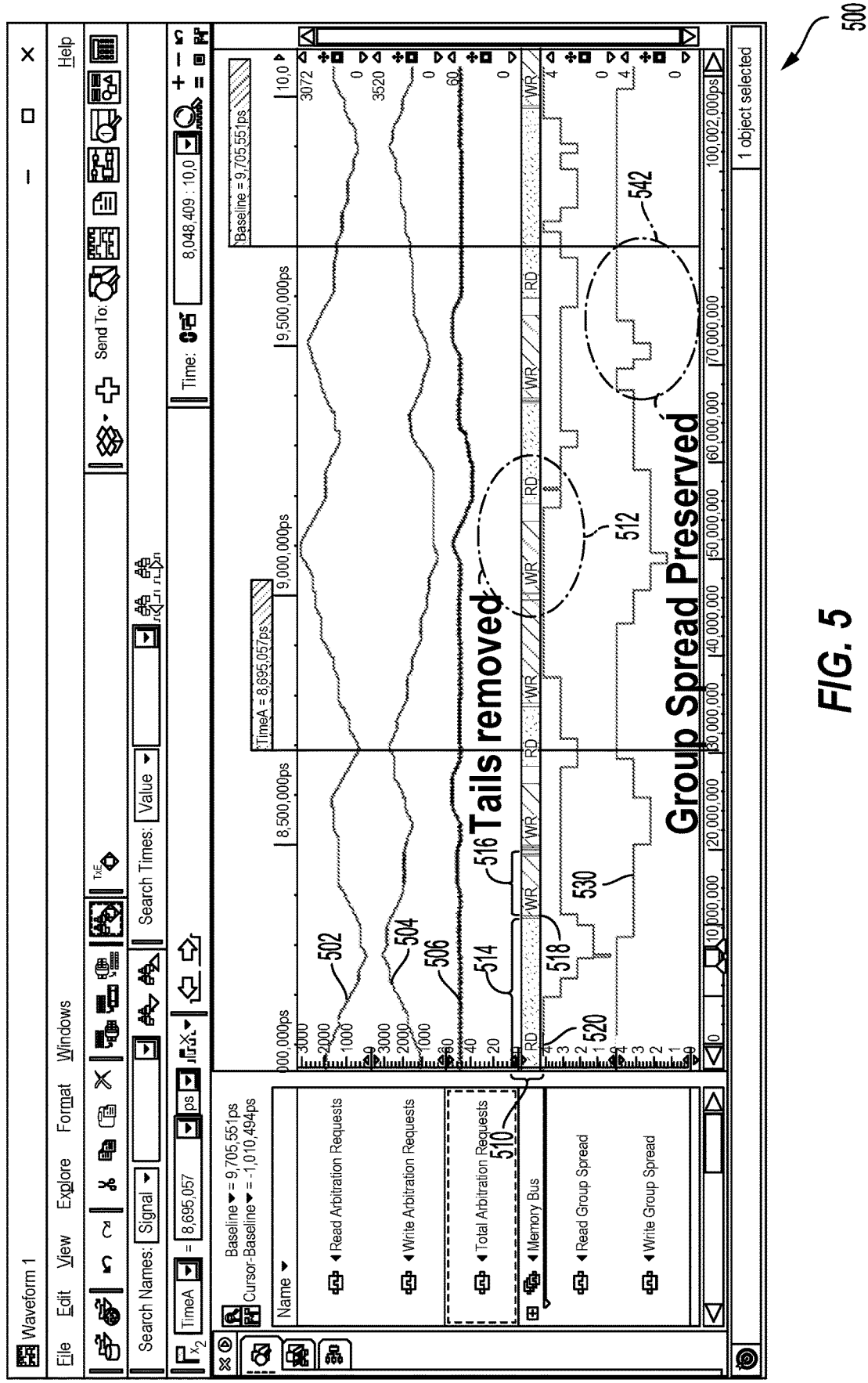
FIG. 5 is a timing diagram illustrating waveforms showing bank-group enhanced batching, according to aspects of the present disclosure.

FIG. 5 is a timing diagram illustrating waveforms showing bank-group enhanced batching, according to aspects of the present disclosure. In this example, the timing diagram 500 also illustrates read arbitration requests 502, write arbitration requests 504, and total arbitration requests 506. The timing diagram 500 also illustrates a memory bus 510, a read-bank group-spread 520, and a write-bank group-spread 530. As noted by the memory bus 510, there are approximately forty-eight (48) candidates illustrated for a memory cycle time (e.g., one millisecond), as indicated by the total arbitration requests 506. In this example a batch of read instructions 514 (e.g., a series of read instructions to the same rank) are followed by a batch of write instructions 516 (e.g., a series of write instructions to the same rank), with a temporal gap 518 in between. As shown by the memory bus 510, fine gaps of the write tail 312 of FIG. 3 are removed, as shown by tails removed 512. In addition, the fine gaps of the read tail 314 of FIG. 3 are also removed.

As shown by the timing diagram 500, the tailoring process of FIG. 4 results in shorter batches of read/write operation due to more frequent batch interruptions, which may lead to lost efficiency. The efficiency loss, however, is compensated by removal of the write tail 312 and read tail 314 shown in FIG. 3. In this example, tailoring of the batch write operations, as shown by tails removed 512, preserves the write group-spread 542. The read-bank group-spread 520 is also preserved according to the tailoring process of FIG. 4. Using the tailoring process of FIG. 4 avoids resource exhaustion at the end of each read batch (RD) and each write batch (WR) by preserving the write group-spread 542, as shown in FIG. 5.

Figure 6:
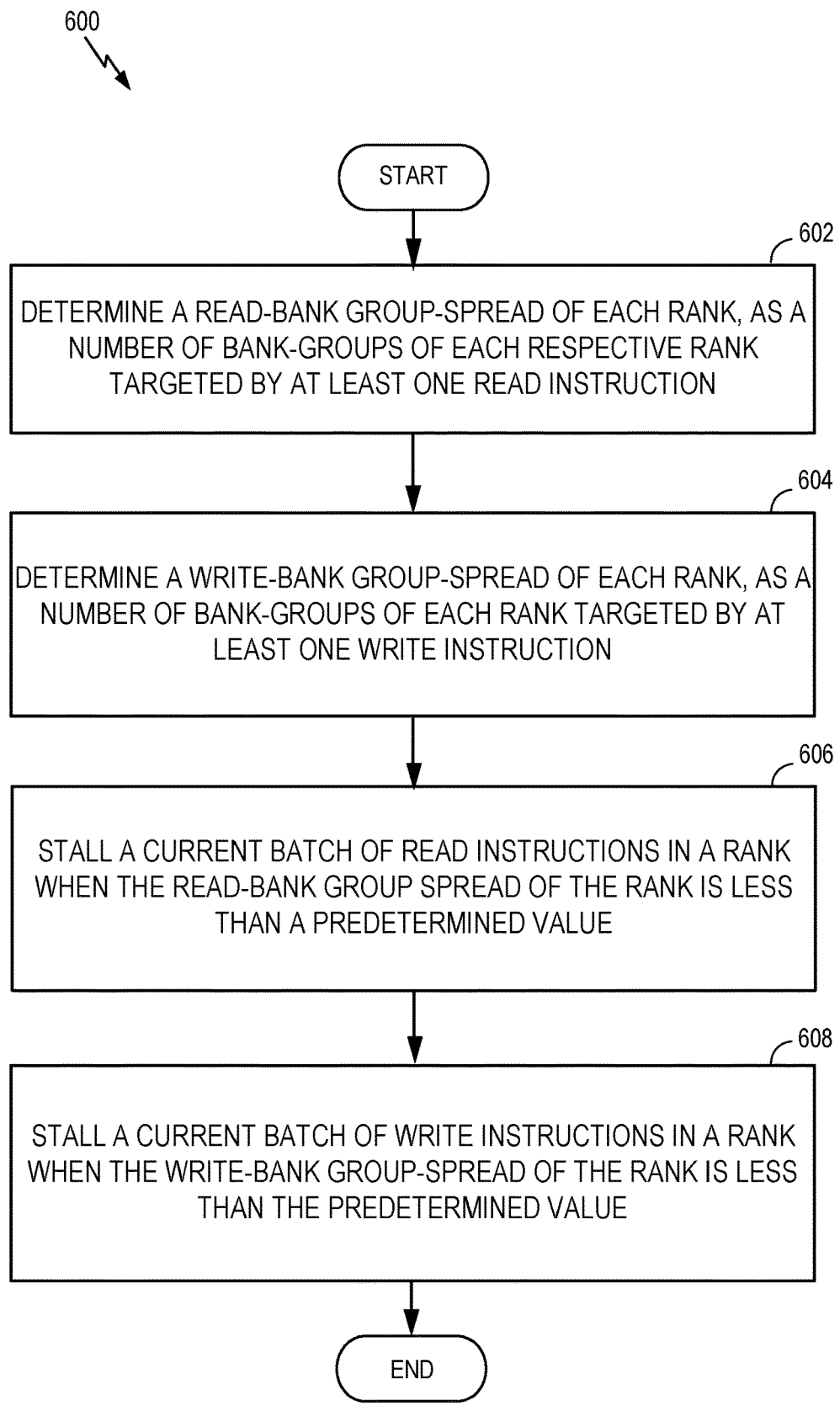
FIG. 6 is a process flow diagram illustrating a method for dynamic memory scheduling with enhanced bank-group batching, according to an aspect of the present disclosure.

FIG. 6 is a process flow diagram illustrating a method for dynamic memory scheduling with enhanced bank-group batching, according to an aspect of the present disclosure. A method 600 begins in block 602, in which a read-bank group-spread of each rank is determined as a number of bank-groups of each respective rank targeted by at least one read instruction. At block 604, a write-bank group-spread of each rank is determined as a number of bank-groups of each rank targeted by at least one write instruction. For example, as shown FIG. 5, a read-bank group-spread 520 and a write-bank group spread are determined prior to the temporal gap 518. In this example, the batch of read instructions 514 are issued to a dynamic memory, such as the dynamic memory 240 of FIG. 2. While the batch of read instructions 514 are performed, the read arbitration requests 502 decrease, as well as the read-bank group-spread 520. By contrast, the write arbitration requests 504 increase while the batch of read instructions 514 are performed.

At block 606, a current batch of read instructions in a rank is stalled when the read-bank group spread of the rank is less than a predetermined value. Alternatively, at block 608, a current batch of write instructions in a rank are stalled when the write-bank group-spread of the rank is less than the predetermined value. In the example shown in FIG. 5, the read-bank group-spread 520 is less than the write-bank group-spread 530, which triggers an interruption of the batch of the read instructions 514 at the temporal gap 518. Following the temporal gap 518, the batch of the write instructions 516 are performed, causing the write arbitration requests 504 to decrease, as well as the write-bank group-spread 530. By contrast, the read arbitration requests 502, as well as the read group-spread, increase while the batch of the bank-group write instructions 516 are performed. The batch of the write instructions is subsequently stalled, while another batch of write instructions is issued to the memory. This aspect of the present disclosure may interrupt a batch sooner when the group spread becomes non-maximal, which helps maintain the read-bank group-spread 520 and the write-bank group-spread 530.

The method 500, may further include issuing a write instruction of a next selected batch of write instructions after the stalling of the current batch of read instructions when the write-bank group-spread of the next selected batch of write instructions is greater than the read-bank group-spread of the current batch of read instructions. In addition, the method 500 may also include issuing a write instruction of a next selected batch of write instructions after the stalling of the current batch of write instructions, in which the next selected batch of write instructions belongs to a different rank (e.g., another rank or other rank) than the current batch of write instructions. The method 500 may further include issuing a read instruction of a next selected batch of read instructions after the stalling of the current batch of write instructions when the read-bank group-spread of the next selected batch of read instructions is greater than the write-bank group-spread of the current batch of write instructions. The method 500 may also include issuing a read instruction of a next selected batch of read instructions after the stalling of the current batch of read instructions, in which the next selected batch of read instructions belongs to a different rank than the current batch of read instructions.

According to aspects of the present disclosure, a memory subsystem with bank-group enhanced batching is described. The memory includes means for stalling a current batch of read instructions or a current batch of write instructions in a rank. The means for stalling may, for example, include the dynamic memory scheduler 204 and/or the memory controller 202, as shown in FIG. 2. In another aspect, the aforementioned means may be any layer, module, or any apparatus configured to perform the functions recited by the aforementioned means.

Figure 7:
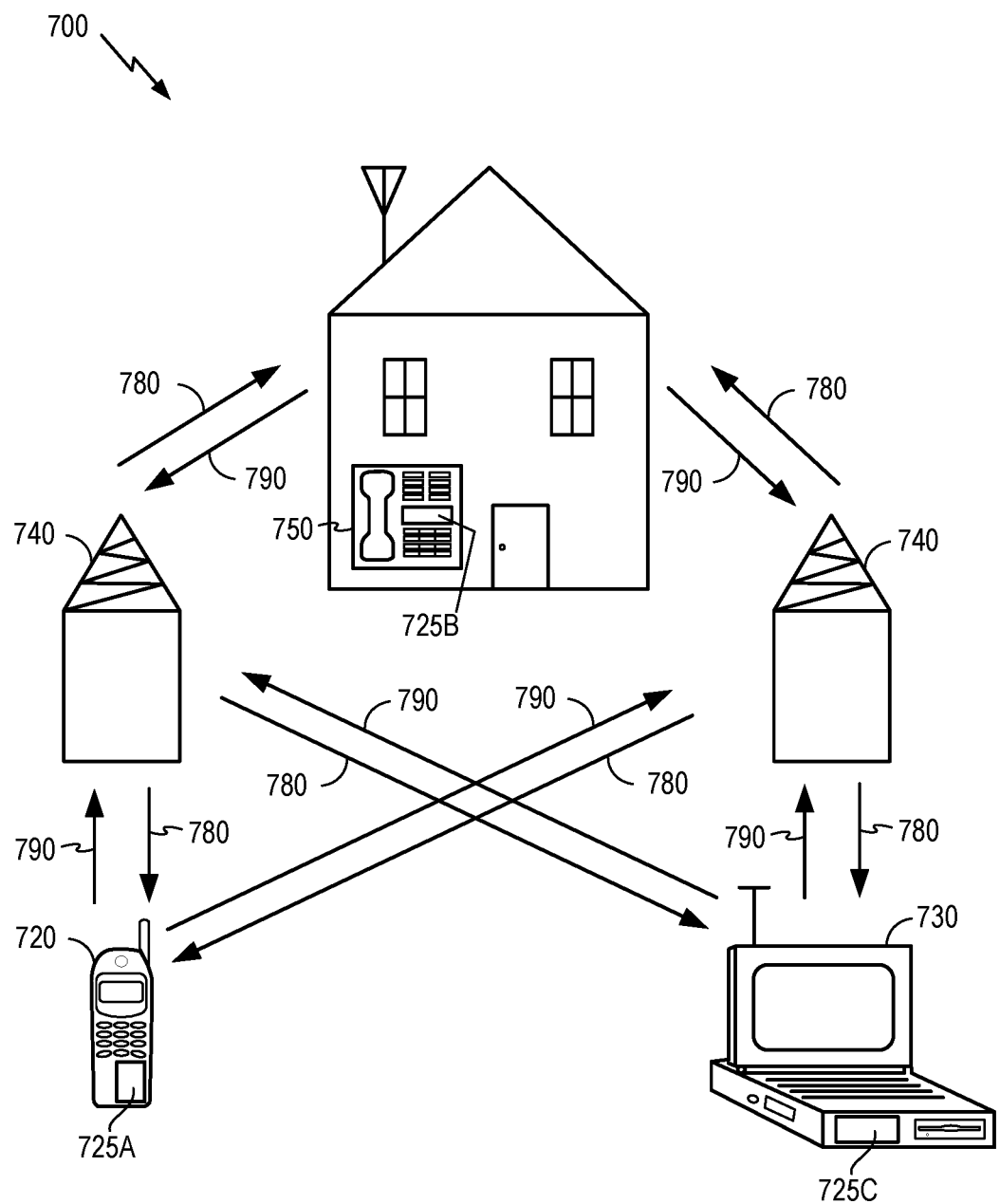
FIG. 7 is a block diagram showing a wireless communications system in which a configuration of the disclosure may be advantageously employed.

FIG. 7 is a block diagram showing an exemplary wireless communications system 700 in which a configuration of the disclosure may be advantageously employed. For purposes of illustration, FIG. 7 shows three remote units 720, 730, and 750, and two base stations 740. It will be recognized that wireless communications systems may have many more remote units and base stations. Remote units 720, 730, and 750 include integrated circuit (IC) devices 725A, 725B, and 725C, which include the disclosed memory subsystem with bank-group enhanced batching. It will be recognized that any device containing an IC may also include the disclosed memory subsystem with bank-group enhanced batching, including base stations, switching devices, and network equipment. FIG. 7 shows forward link signals 780 from the base stations 740 to the remote units 720, 730, and 750, and reverse link signals 790 from the remote units 720, 730, and 750 to the base stations 740.

In FIG. 7, a remote unit 720 is shown as a mobile telephone, a remote unit 730 is shown as a portable computer, and a remote unit 750 is shown as a fixed location remote unit in a wireless local loop system. For example, the remote units may be a mobile phone, a hand-held personal communications systems (PCS) unit, a portable data unit such as a personal data assistant, a GPS enabled device, a navigation device, a set top box, a music player, a video player, an entertainment unit, a fixed location data unit such as meter reading equipment, or any other device that stores or retrieves data or computer instructions, or any combination thereof. For example, a remote unit including the low power memory sub-system may be integrated within a vehicle control system, a server computing system, or other like system specifying critical data integrity. Although FIG. 7 illustrates IC devices 725A, 725B, and 725C, which include the disclosed memory subsystem with bank-group enhanced batching, the disclosure is not limited to these exemplary illustrated units. Aspects of the present disclosure may be suitably employed in any device, which includes the memory subsystem with bank-group enhanced batching.

For a firmware and/or software implementation, the methodologies may be implemented with modules (e.g., procedures, functions, and so on) that perform the described functions. Any machine-readable medium tangibly embodying instructions may be used in implementing the methodologies described. For example, software codes may be stored in a memory and executed by a processor unit. Memory may be implemented within the processor unit or external to the processor unit. As used, the term "memory" refers to any type of long term, short term, volatile, non-volatile, or other memory and is not to be limited to any particular type of memory or number of memories, or type of media upon which memory is stored.

If implemented in firmware and/or software, the functions may be stored as one or more instructions or code on a non-transitory computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer. Disk and disc, as used, include compact disc (CD), laser disc, optical disc, digital versatile disc (DVD) and Blu-ray® disc, where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description is provided to enable any person skilled in the art to practice the various aspects described. Various modifications to these aspects will be readily apparent to those skilled in the art, and the generic principles defined may be applied to other aspects. Thus, the claims are not intended to be limited to the aspects shown, but is to be accorded the full scope consistent with the language of the claims, in which reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b, and c. All structural and functional equivalents to the elements of the various aspects described throughout this disclosure that are known or later come to be known to those of ordinary skill in the art are expressly incorporated by reference and are intended to be encompassed by the claims. Moreover, nothing disclosed is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. A method for dynamic memory scheduling with enhanced bank-group batching, the method comprising:

determining a read-bank group-spread of each rank, as a number of bank-groups of each respective rank targeted by at least one read instruction;

determining a write-bank group-spread of each rank, as a number of bank-groups of each rank targeted by at least one write instruction;

stalling a current batch of read instructions in a rank when the read-bank group-spread of the rank is less than a predetermined value; or stalling a current batch of write instructions in a rank when the write-bank group-spread of the rank is less than the predetermined value.

2. The method of claim 1, in which the predetermined value comprises a maximum read-bank group-spread in all ranks of a dynamic memory.

3. The method of claim 1, further comprising issuing a read instruction of a next selected batch of read instructions after the stalling of the current batch of write instructions when the read-bank group-spread of the next selected batch of read instructions is greater than the write-bank group-spread of the current batch of write instructions.

4. The method of claim 1, further comprising issuing a read instruction of a next selected batch of read instructions after the stalling of the current batch of read instructions, in which the next selected batch of read instructions belongs to a different rank than the current batch of read instructions.

5. The method of claim 1, further comprising delaying the stalling of the current batch of read instructions until a temporal gap is detected.

6. The method of claim 1, further comprising issuing read candidates in another rank when a read-bank group spread of the other rank is a maximum read-bank group-spread in all ranks of a dynamic memory.

7. The method of claim 1, further comprising issuing a write instruction of a next selected batch of write instructions after the stalling of the current batch of read instructions when the write-bank group-spread of the next selected batch of write instructions is greater than the read-bank group-spread of the current batch of read instructions.

8. The method of claim 1, further comprising issuing a write instruction of a next selected batch of write instructions after the stalling of the current batch of write instructions, in which the next selected batch of write instructions belongs to a different rank than the current batch of write instructions.

9. The method of claim 1, further comprising delaying the stalling of the current batch of write instructions until a temporal gap is detected.

10. The method of claim 1, further comprising issuing write candidates in another rank when a write bank group spread of the other rank is a maximum write-bank group-spread in all ranks of a dynamic memory.

11. A non-transitory computer-readable medium having program code recorded thereon for dynamic memory scheduling with enhanced bank-group batching, the program code executed by a processor and comprising:

program code to determine a read-bank group-spread of each rank, as a number of bank-groups of each respective rank targeted by at least one read instruction;

program code to determine a write-bank group-spread of each rank, as a number of bank-groups of each rank targeted by at least one write instruction;

program code to stall a current batch of read instructions in a rank when the read-bank group-spread of the rank is less than a predetermined value; and program code to stall a current batch of write instructions in a rank when the write-bank group-spread of the rank is less than the predetermined value.

12. The non-transitory computer-readable medium of claim 11, further comprising:

program code to issue a read instruction of a next selected batch of read instructions after the stalling of the current batch of write instructions when the read-bank group spread of the next selected batch of read instructions is greater than the write-bank group-spread of the current batch of write instructions.

13. The non-transitory computer-readable medium of claim 11, further comprising:

program code to delay the stalling of the current batch of read instructions until a temporal gap is detected.

14. The non-transitory computer-readable medium of claim 11, further comprising:

program code to issue read candidates in another rank when a read-bank group spread of the other rank is a maximum read-bank group-spread in all ranks of the dynamic memory.

15. The non-transitory computer-readable medium of claim 11, further comprising:

program code to issue a write instruction of a next selected batch of write instructions after the stalling of the current batch of read instructions when the write-bank group-spread of the next selected batch of write instructions is greater than the read-bank group-spread of the current batch of read instructions.

16. The non-transitory computer-readable medium of claim 11, further comprising:

program code to delay the stalling of the current batch of write instructions until a temporal gap is detected.

17. The non-transitory computer-readable medium of claim 11, further comprising:

program code to issue write candidates in another rank when a write bank group spread of the other rank is a maximum write-bank group-spread in all ranks of the dynamic memory.

18. A memory subsystem, comprising:

a first memory rank comprising a plurality of first bank groups;

a second memory rank comprising a plurality of second bank groups;

an IO controller coupled to the first memory rank and the second memory rank;

dynamic arbitration logic configured to determine a read-bank group-spread of the first memory rank and the second memory rank, as a number of bank-groups of each respective memory rank targeted by at least one read instruction, and configured to determine a write-bank group-spread of the first memory rank and the second memory rank, as a number of bank-groups of each memory rank targeted by at least one write instruction; and a dynamic memory scheduler configured to stall a current batch of read instructions in a memory rank when the read-bank group-spread of the memory rank is less than a predetermined value, or configured to stall a current batch of write instructions in a memory rank when the write-bank group-spread of the memory rank is less than the predetermined value.

19. The memory subsystem of claim 18, in which the dynamic memory scheduler is further configured to delay the stall of the current batch of read instructions until a temporal gap is detected.

20. The memory subsystem of claim 18, in which the dynamic memory scheduler is further configured to delay the stall of the current batch of write instructions until a temporal gap is detected.

\* \* \* \* \*